United States Patent [19]
Thiebaud et al.

[11] Patent Number: 5,325,812
[45] Date of Patent: Jul. 5, 1994

[54] SUBSTRATE HOLDING AND ROTATING ARRANGEMENT FOR VACUUM PROCESSES

[75] Inventors: Francis Thiebaud, Oberschan, Switzerland; Friedrich Stingl, Balzers, Liechtenstein

[73] Assignee: Balzers Aktiengesellschaft, Balzers, Liechtenstein

[21] Appl. No.: 988,728

[22] Filed: Dec. 10, 1992

[30] Foreign Application Priority Data

Dec. 19, 1991 [CH] Switzerland .............. 3790/91

[51] Int. Cl.$^5$ .............................................. B05C 13/00
[52] U.S. Cl. ...................................... 118/500; 118/728; 269/254 R; 204/298.15
[58] Field of Search ............... 118/500, 503, 715, 728, 118/729, 731, 502; 269/254 R; 359/819; 204/298.15

[56] References Cited

U.S. PATENT DOCUMENTS

| | | | |
|---|---|---|---|
| 4,412,504 | 11/1983 | Bonu | 118/500 X |
| 4,817,559 | 4/1989 | Ciparisso | 118/731 |
| 5,124,019 | 6/1992 | Kunkel et al. | 118/731 X |

*Primary Examiner*—Michael W. Ball
*Assistant Examiner*—Francis J. Lorin
*Attorney, Agent, or Firm*—Notaro & Michalos

[57] ABSTRACT

In order to dispose substrates, such as lenses, having different sizes in a working installation, a holding arrangement comprises a spring clasp (3) provided for the clamping holding of the substrates or lenses, which spring clasp is suitable for disposition in a holding device (9) of the arrangement.

8 Claims, 6 Drawing Sheets

FIG. I

SUBSTRATE HOLDING AND ROTATING ARRANGEMENT FOR VACUUM PROCESSES

FIELD AND BACKGROUND OF THE INVENTION

The present invention relates to an arrangement for holding substrates for working with vacuum processes, such as lenses, having different sizes as well as a multi-substrate holder with a multiplicity of arrangements.

For substrate holding arrangements, such as for example glass lens holding rings, as well as substrate rotating holders for coating installations various implementations are known in the field. The prior art includes CH-PS 631 638, 659 485, EP-A-0 215 261, DE-OS 35 13 137, 39 21 671 as well as DE-A-37 15 831.

In the cited prior art either single or multisubstrate holders are suggested by means of which it is possible to change substrates in the holder relatively rapidly and to dispose in it, if necessary, substrates, such as for example optical lenses, having different dimensions. It is also suggested in the prior art to provide a rotating arrangement so that the substrates, such as for example optical lenses, can be rotated in the holding device for the purpose of bilateral coating.

SUMMARY OF THE INVENTION

The task of the present invention also resides in providing a substrate holding arrangement in which substrates, such as for example the stated optical lenses, having different dimensions can be disposed or exchanged rapidly and simply. A further task resides in implementing the arrangement in such a way that it can be disposed in a corresponding rotating arrangement in order to be able to work substrates bilaterally, i.e. sequentially on one side each, without needing to open the vacuum process chamber to carry out the rotation manually.

According to the invention the tasks posed are solved by means of an arrangement for holding substrates, such as lenses, having different sizes.

The invention includes an arrangement comprising an outer holding device such as for example a carrying ring, and an inner spring clasp open on one side and to be disposed in the holding device, which is provided for the encompassing clamping holding of a flat substrate, such as a lens. Depending on the peripheral contour of the flat substrate, the spring clasp is for example angular, oval or at least nearly circular and comprises a holding element at one clasp end each for clamping of the substrate.

The spring clasp comprises, preferably in the region opposite the opening of the clasp, at least one bearing element or a support in order to support the spring clasp together with the holding element(s) in corresponding receivers in or on the holding device.

The receivers for the holding element(s) comprise preferably several snap-in positions in order to tighten the spring clasp differentially depending on the substrate size.

Further preferred embodiments of the arrangement according to the invention are characterized in the claims.

The arrangements according to the invention stated above are particularly suitable to be positioned in a working chamber and potentially on a multi-substrate holder intended for the uni- or bilateral treatment or coating of optical substrates, such as lenses, mirrors, filters, and the like. Preferred embodiments of the multi-substrate holders are also characterized in the claims.

BRIEF DESCRIPTION OF THE DRAWINGS

The invention will now be explained in further detail by example and with reference to the enclosed drawing in which.

DESCRIPTION OF THE PREFERRED EMBODIMENTS

Figure 1:
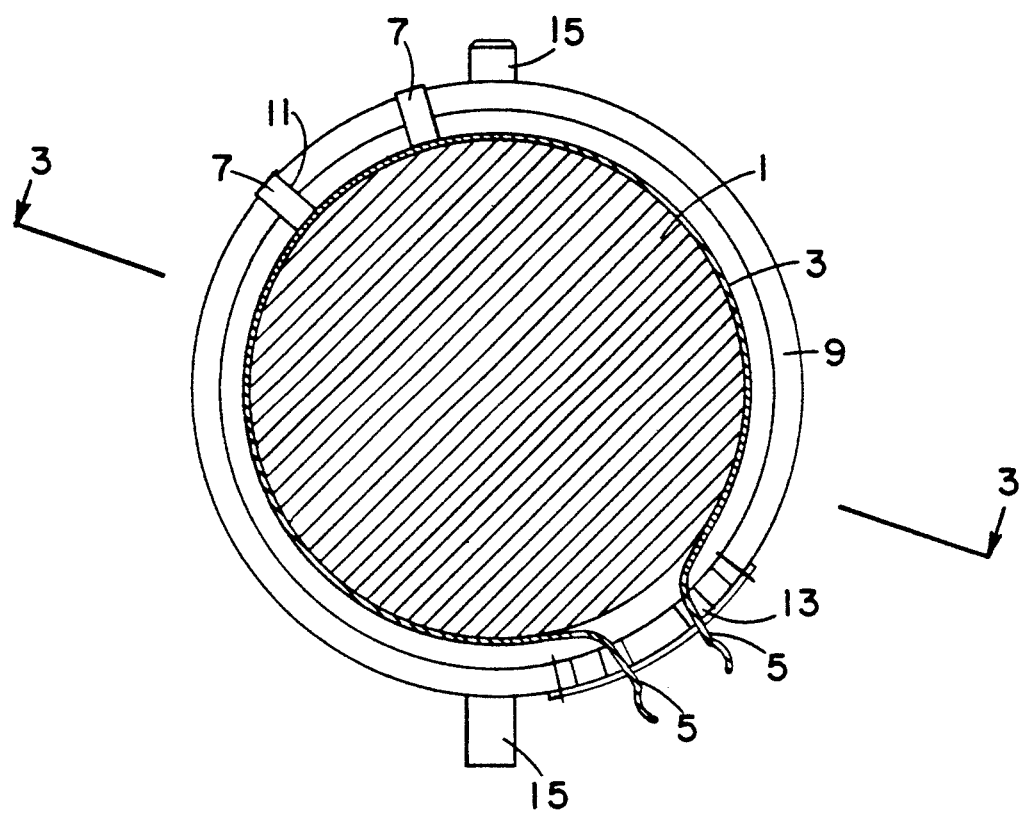
FIG. 1 is a top view onto a holding arrangement according to the invention with a clamped-in lens.

FIG. 1 is a top view of substrate holding arrangement according to the invention. This is a lens holding device for holding tightly a lens 1, for example for disposing it in a working or coating installation. The lens 1 is clamped into a spring clasp 3, which is open on one side and which comprises at one end each on the open side one holding element or holding grip 5 by means of which the lens, clamped into the spring clasp 3, can be held. Opposing the holding grips 5 the spring clasp has bearing necks or supports 7 for supporting the spring clasp in receivers 11 of a holding device or a carrying ring 9.

For the support or snapping-in of the holding grips 5 the carrying ring further has receivers 13 which are disposed essentially opposing the receivers 11. For the support, lastly, of the holding or carrying ring 9 in a working installation are provided fastening elements 15 extending radially toward the outside.

Figure 2:
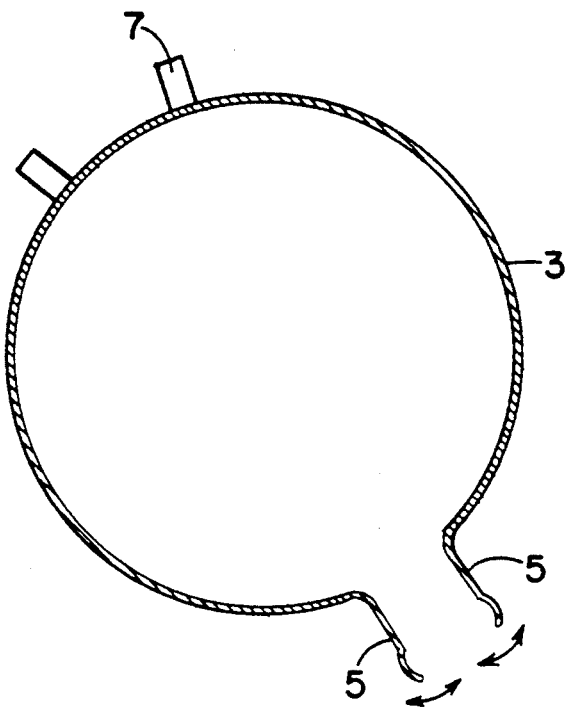
FIG. 2 is a top view of the clasp of FIG. 1.

In FIG. 2 is depicted in isolation the spring clasp 3 ready to receive a lens. As is clearly apparent in FIG. 2 lenses of different sizes can be received or clamped in with a spring clasp 3, such as is depicted in FIG. 2. Depending on the size of the clamped-in lens, the holding grips 5 are guided in the direction of the arrow more strongly toward each other or away from each other. The changing of the lenses can take place rapidly and simply.

If angular, oval or other substrates are to be clamped in, the spring clasp, adapted to the peripheral contour of the substrate, can be implemented accordingly and must not necessarily be round as in the depicted example.

Figure 3:
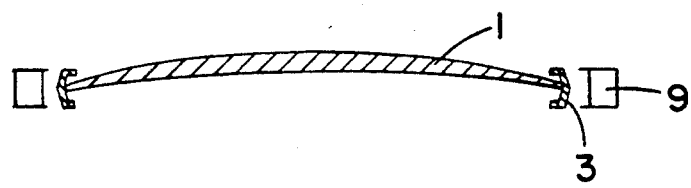
FIG. 3 is a section through the holding arrangement of FIG. 1 taken along line 3—3 of FIG. 1.

In FIG. 3 is depicted a section along line 3—3 of FIG. 1, in which it is clear that also lenses 1 having different thicknesses can be disposed in the clasp wherein advantageously an arcuate wall or one reaching beyond the substrate edge of the spring clasp can be used. A further advantage of the construction reaching around the substrate edge resides therein that substrates can be held in the edge region with low radial stress which is advantageous in particular for the reason that, as is known, certain substrate materials are sensitive to the action of force upon them. For example, in the case of substrates, such as optical lenses, comprising materials such as glass or synthetic material, through the gentle holding breakouts or deformations can be avoided.

FIG. 4 shows again, analogously to FIG. 1, in top view a holding arrangement according to the invention for a substrate or a lens 1, wherein, however, the fastening elements 15 are implemented as supports for a rotating arrangement, further comprising a rotation lever 17, so that the carrying or holding ring can be rotated for example by 180°. In this way it becomes possible to work or to coat a lens 1 in a working installation sequentially on both side.

Figure 4:
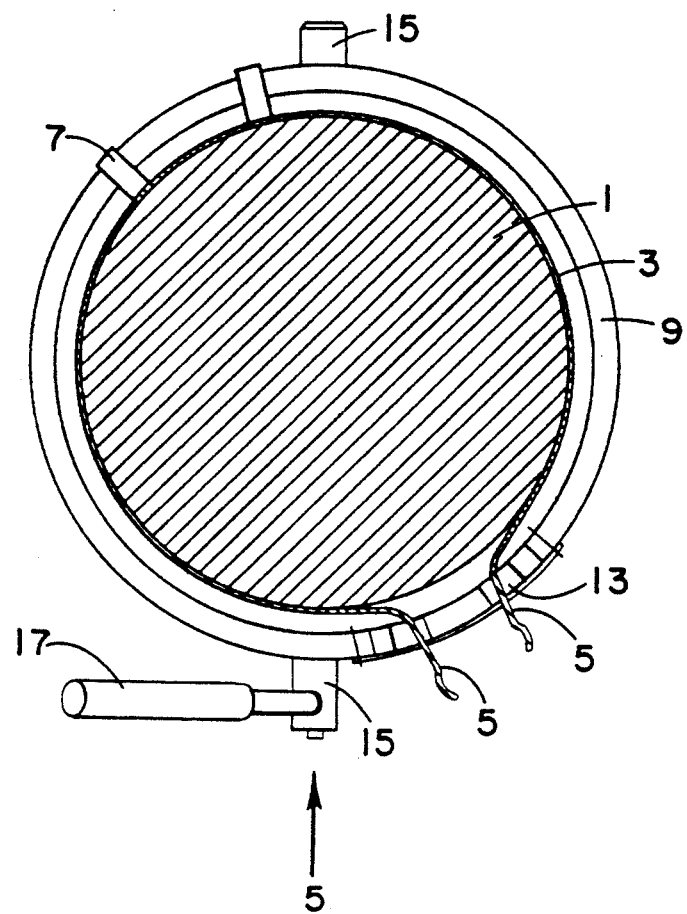
FIG. 4 is a view similar to FIG. 1, further comprising a rotating arrangement.
Figure 5:
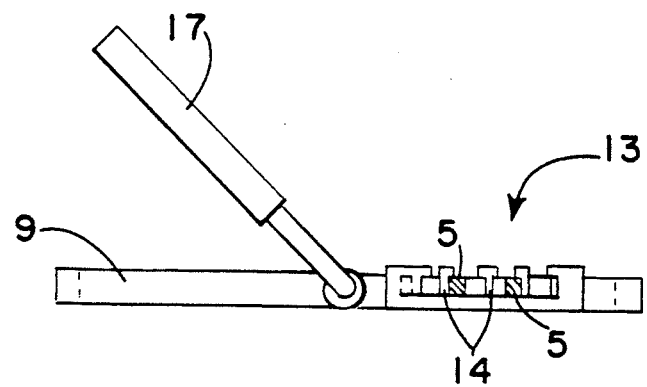
FIG. 5 illustrates the holding arrangement of FIG. 4, seen from the front in the direction of arrow 5 in FIG. 4.

In FIG. 5 is depicted as a lateral view the view from FIG. 4 in the direction of arrow 5 depicting in particular the receiver 13 in the carrying or holding ring 9, for the reception of the two holding grips 5 of the spring clasp 3. As is evident in FIG. 5, the further receiver 13 comprises different snap-in positions 14 with which the two holding grips 5, depending on the size of the clamped-in lens 1, can each be clamped in several positions in one of the receivers 13.

The substrate holding device depicted in FIGS. 1 to 5 has essential advantages compared to the known holding devices according to prior art, wherein the most important ones are the following:

A large selection of large flat substrates, such as for example lenses, mirrors, filters and the like, can be covered with very few parts, i.e. the substrate holding device defined according to the invention makes possible a high degree of flexibility which is particularly important in coating lenses for eye glasses.

Simple taking-apart of the substrate holding device for the purpose of cleaning.

The lens to be coated is minimally shaded at the edge, i.e. for example less than 0.5 mm.

Through the low radial stress in the edge region no mechanical damages and deformations result in the case of sensitive substrates, such as lenses. In particular in the case of synthetic material lenses a damaging deforming during thermal loading of the substrates can be avoided.

With the same spring clasp different lens diameters and different lens thicknesses can be clamped in with the same substrate holding device; and short charging time as well as reliable and reproducible operating manner.

Figure 6:
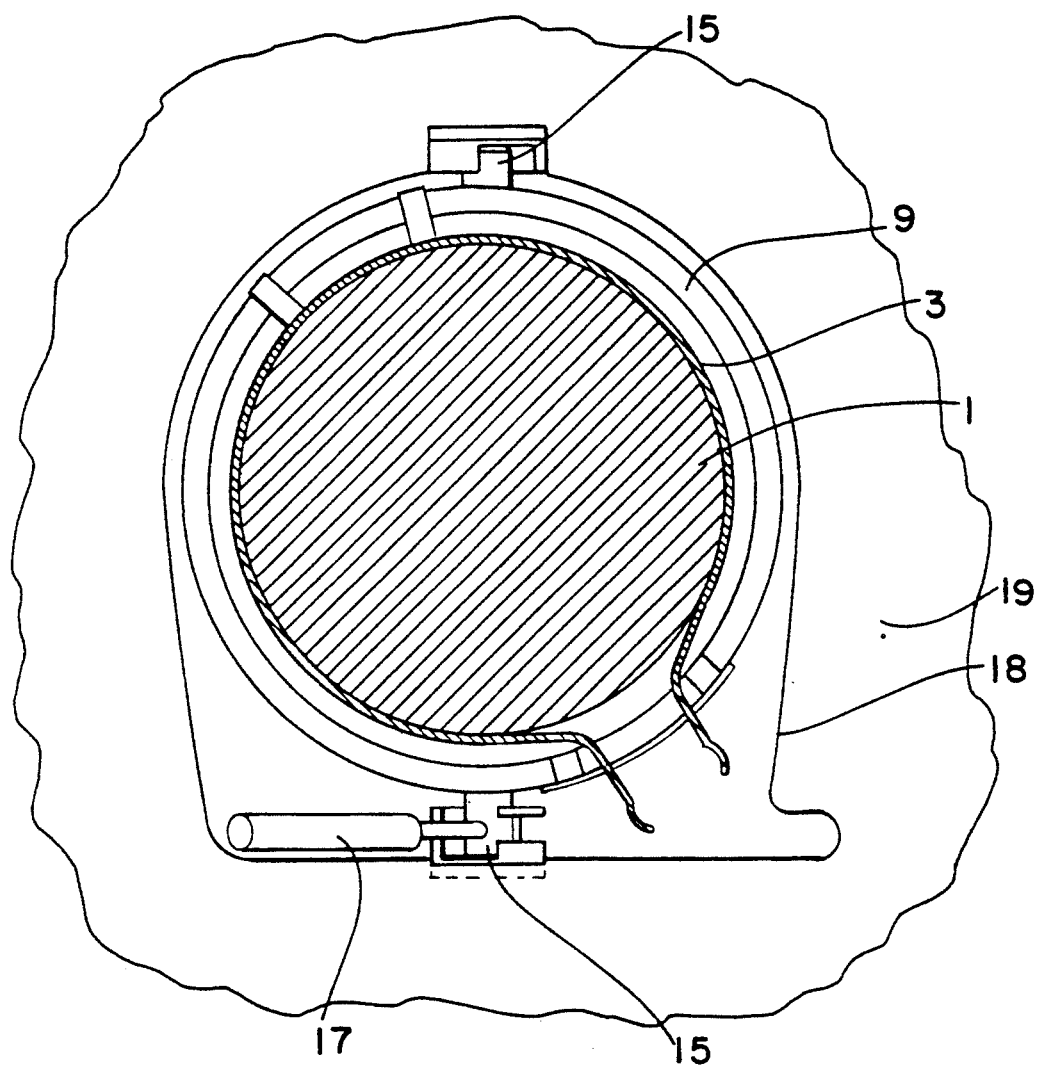
FIG. 6 is a top view depicting a substrate holding arrangement positioned in a flat holding structure or device.
Figure 7:
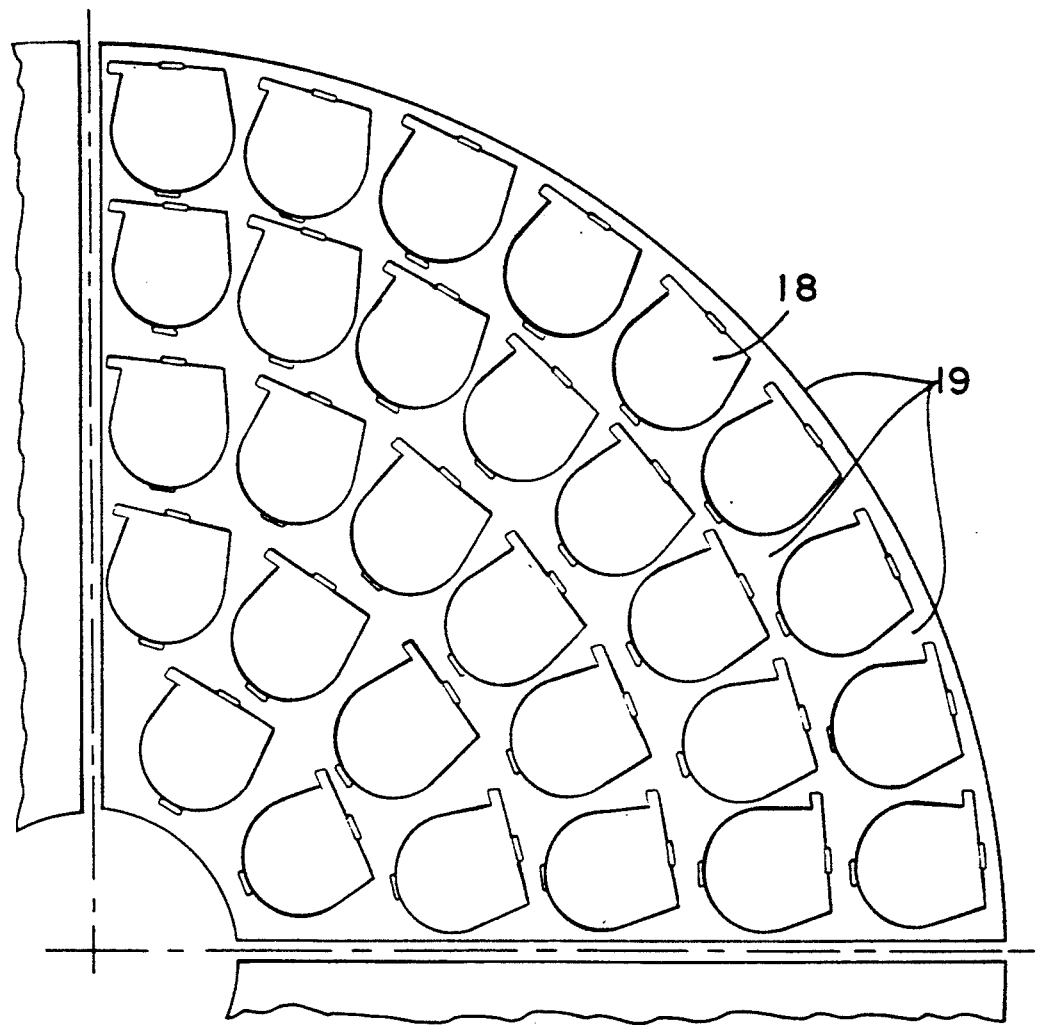
FIG. 7 illustrates a multi-substrate holder in plan view.

The substrate holding devices depicted in FIGS. 1 to 5 are especially suited for the clamping and storing of substrates, such as lenses, in vacuum coating installations, which will be dealt with in greater detail with reference to FIGS. 6 and 7.

FIG. 6 depicts a segment from a holding organ or device 19 with a substrate holder defined according to the invention, analogous to that of FIG. 4, wherein the holding organ 19 is provided and is suitable for the purpose of encompassing several substrate holders of this type. The flat holding organ 19 can be, for example, a carrier in the form of plates or vaulted sections in or on which several substrate holders of the described type are disposed for the reception and coating of substrates, such as for example lenses. In the holding organ 19 is provided an opening 18 in which the substrate holding device according to the invention is disposed, rotatably supported with the two fastening elements 15 in corresponding receivers on the holding device 19.

We are at this point omitting the description of the substrate holding device and reference is made to FIG. 4.

In the depicted substrate holding device is disposed a lens 1, clamped in the spring clasp 3, in order to be coated in a vacuum installation disposed in the holding device 19. If the lens 1 is to be coated on one side, it can, clamped in the substrate holding device, be rotated about 180° by means of the lever 17 about the two fastening elements 15, since due to the opening 18 the substrate holding device is freely rotatable in the carrier plate 19. After the rotation about 180° of the substrate holding device, the lens can also be coated on its back side. The advantage of the described rotation process resides therein that the coating of the back side can take place without long interruption of the working process and without opening the installation.

In FIG. 7 is depicted a whole segment of a plate-form holding organ 19 comprising a number of openings 18 intended for the disposition of substrate holding devices described according to the invention. It is clear in FIG. 7 that in the same holding organ 19 simultaneously several lenses can be coated and that by means of the above described rotation process the coating of the lens can take place on both sides. For the rotation of the individual lenses either individually for each substrate holding device a separate rotating arrangement can be provided or the carrier plate can be rotated about a central axis wherein each of the rotation levers 17 depicted in FIG. 6, extends from each substrate holding device toward an angled stop whereby the substrates are rotated in simple manner. An angled mechanism of this type will be explained in further detail with reference to FIG. 8.

The described holding organ 19 can be either a planar plate or also an arcuate surface. It is in every case essential that the substrate holders are disposed in such a way that they lie in the same plane. The selection of an appropriate surface arc depends in known manner on the dimensions of the vapor deposition arrangement.

Figure 8:
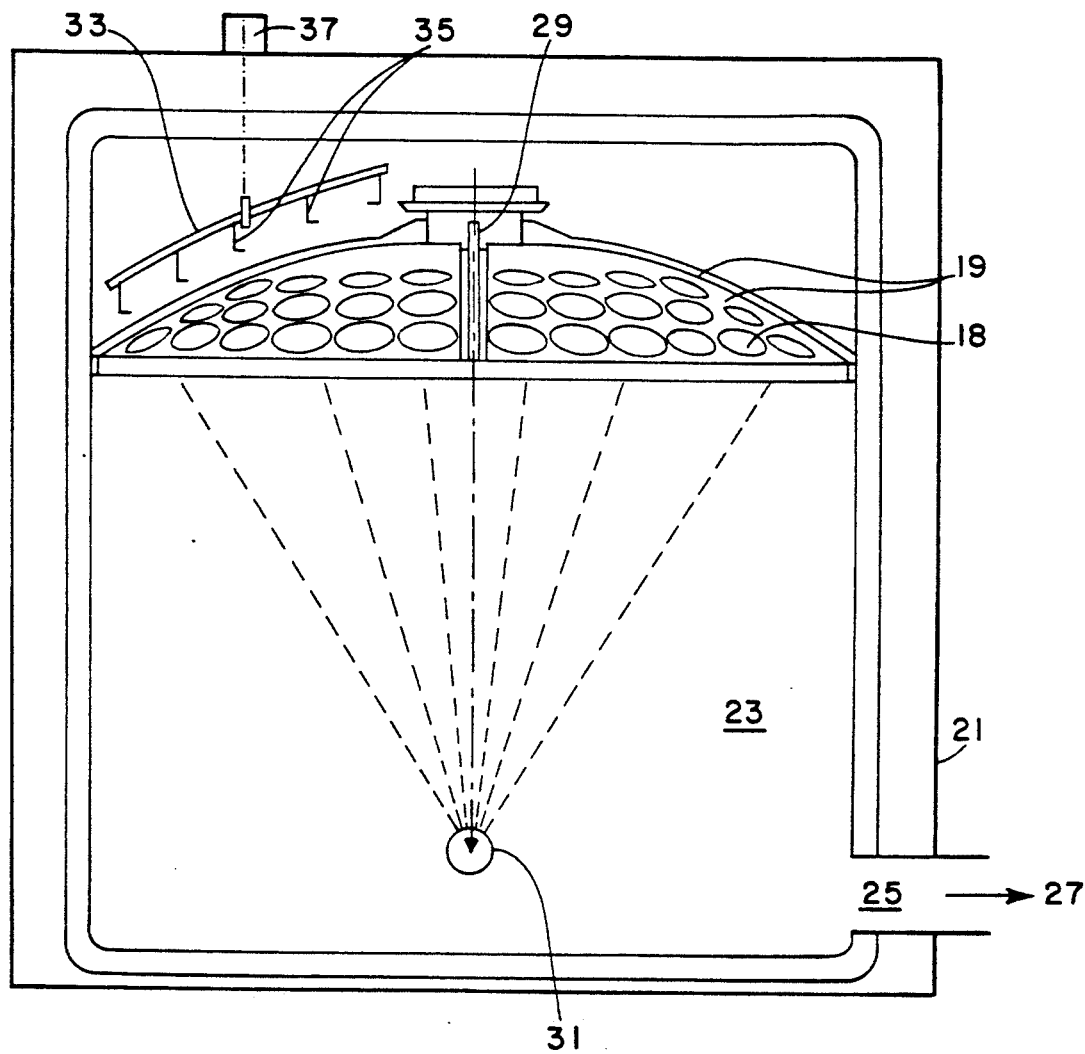
FIG. 8 illustrates a further multi-substrate holder, disposed in a vapor deposition installation.

In contrast to the flat holding organ 19 of FIG. 7 in FIG. 8 is depicted a vault-like holding organ 19 disposed in a vacuum chamber 23 of a vapor deposition installation 21. The vapor deposition installation 21 is therein depicted in lateral view from the front with the front opening removed so that the vault-like substrate holder 19 is visible. Depicted schematically, the vapor deposition installation 21 comprises an outlet opening 25 which leads for example to a vacuum pump 27 by means of which the working volume 23 can be evacuated.

The vault-like holding organ 19 comprises in the openings 18 according to the invention the discrete substrate holding devices the depiction of which has been omitted for reasons of clarity. The holding organ 19 is further supported so as to be freely rotatable about an axis 29 so that the vault section during the vapor deposition from a vaporization source 31 can be rotated by means of a drive. This method of rotating with a drive about a central axis is in particular advantageous in order to be able to ensure a homogeneous layer thickness distribution. The vaporization source 31 can be for example an electron beam vaporization source.

If the optical substrates, such as for example lenses, mirrors, filters, and the like, disposed in the openings 18 are coated on one side, an angled mechanism 33 for rotating the discrete substrate holders is lowered by means of a lowering mechanism 37 toward the vault-like holding organ 19. If the angled mechanism 33 has been sufficiently lowered, the individual rotating hooks 35 engage the rotation levers 17 of the discrete substrate holding devices and, by rotating the holding organ 19 by 360°, all substrate holders are rotated about 180°.

After the rotation operation, the angled mechanism 33 is again retracted by the lowering mechanism 37 and the coating process in the vapor deposition installation can be continued. It is therein of advantage if the same drive for the rotating motion of the vault-like holding organ 19 is also used for driving the lowering mechanism 37.

The embodiments depicted in FIGS. 1 to 8 are examples which are exclusively intended for a further explanation of the invention. It is understood, that it is possible to modify or to change the depicted embodiments in any desired manner and type; it is in particular possible for example to implement differently the support of the spring clasp 3 in a holding or carrying ring 9. It is also not absolutely necessary to provide a holding ring 9, and the holding device used for supporting the spring clasp 3 can also be for example square or rectangular or oval or be implemented in any other way and type.

An essential part of the invention is the use of a spring clasp defined according to the invention which, together with a substrate to be clamped in, is supported in a holding device, for example for introducing it into a vacuum working installation.

While the specific embodiments of the invention have been shown and described in detail to illustrate the application of the principles of the invention, it will be understood that the invention may be embodied otherwise without departing from such principles.

What is claimed is:

1. Arrangement for holding essentially flat substrates having different sizes for being disposed in a vacuum working installation comprising:
   an outer, essentially rigid holding device (9); and
   a spring clasp (3) having two ends which can be placed into the holding device (9) having a plurality of receivers (11,13) for holding a substrate (1), the spring clasp (3) holding the substrate (1) according to a peripheral contour of a substrate having an angular, oval or at least nearly circular shape, and a holding element (5) at each end of the clasp for clamping in the substrate, the spring clasp (3) having at least one essentially outwardly directed support element (7) for supporting the spring clasp together with the holding element (5) in the holding device (9) or on the receivers (11, 13).

2. Arrangement according to claim 1, wherein the spring clasp (3) is implemented essentially annularly for the clamping of essentially circular flat substrates (12) in the holding device or in a carrying ring (9).

3. Arrangement according to claim 1, wherein the at least one receiver (13) is provided on the holding device (9) for the support of the holding grips (5) of the clasp (3) and comprises several snap-in positions (14) in order to clamp the spring clasp (3) differentially or to clamp different substrate sizes in the spring clasp.

4. Arrangement according to claim 1, wherein the inside of the spring clasp (3) is implemented in such a way that it at least partially reaches beyond the substrate edge in order to make possible the clamping of substrates having different thicknesses or in order to make possible the holding of substrates with low radial stress in the edge region.

5. Arrangement according to claim 1, wherein the holding elements are holding grips (5) directed radially outward from the spring clasp.

6. Arrangement according to claim 1, wherein the holding device (9) comprises at least one fastening element (15) for disposing it in a working installation.

7. Arrangement according to claim 1, wherein two opposing fastening element (15) are provided and comprise pivot bearings for the holding device or the carrying ring (9) for receiving a rotating arrangement.

8. Arrangement according to claim 7, including a rotating arrangement comprising an actuation element (17), on at least one of the fastening elements (15) for the rotation of the holding device (9).

* * * * *